United States Patent [19]
Sammakia et al.

[11] Patent Number: 6,058,015
[45] Date of Patent: May 2, 2000

[54] ELECTRONIC PACKAGES AND A METHOD TO IMPROVE THERMAL PERFORMANCE OF ELECTRONIC PACKAGES

[75] Inventors: Bahgat Ghaleb Sammakia, Newark Valley; Sanjeev Balwant Sathe, Johnson City, both of N.Y.

[73] Assignee: International Business Machines Corp., Armonk, N.Y.

[21] Appl. No.: 09/329,131

[22] Filed: Jun. 9, 1999

Related U.S. Application Data

[62] Division of application No. 08/923,008, Sep. 3, 1997.

[51] Int. Cl.$^7$ ........................................ H05K 7/20
[52] U.S. Cl. ..................... 361/705; 174/16.3; 257/719; 361/710; 361/715; 361/714
[58] Field of Search ................................ 165/80.2, 80.3, 165/185; 174/16.3; 257/707, 712, 718, 726–727

[56] References Cited

U.S. PATENT DOCUMENTS

| | | |
|---|---|---|
| 4,849,856 | 7/1989 | Funari et al. . |
| 5,022,462 | 6/1991 | Flint et al. . |
| 5,548,482 | 8/1996 | Hatauchi et al. . |
| 5,581,442 | 12/1996 | Morosas . |
| 5,595,240 | 1/1997 | Daikoku et al. . |
| 5,602,719 | 2/1997 | Kinion . |
| 5,949,137 | 9/1999 | Domadia et al. ........................ 257/712 |

*Primary Examiner*—Gregory Thompson
*Attorney, Agent, or Firm*—Scully, Scott, Murphy & Presser; Lawrence R. Fraley, Esq.

[57] ABSTRACT

An electronic package incorporating a heat-generating element which is thermally coupled to a heat-sinking member, through the utilization of a predetermined thermally conductive material, and wherein all of these components are placed in compression during package operation so as to resultingly improve the thermal performance of the electronic package. A method is set forth of improving the thermal performance of an electronic package through the intermediary of compressive forces being generated between the package components during package operation.

6 Claims, 1 Drawing Sheet

ELECTRONIC PACKAGES AND A METHOD TO IMPROVE THERMAL PERFORMANCE OF ELECTRONIC PACKAGES

CROSS-REFERENCE TO RELATED APPLICATIONS

This application is a divisional application of Ser. No. 08/923,008; filed on Sep. 3, 1997.

BACKGROUND OF THE DISCLOSURE

1. Field of the Invention

The present invention relates to an electronic package incorporating a heat-generating element which is thermally coupled to a heat-sinking member, through the utilization of a predetermined thermally conductive material, and wherein all of these components are placed in compression during package operation so as to resultingly improve the thermal performance of the electronic package. Moreover, the invention is directed to a method of improving the thermal performance of an electronic package through the intermediary of compressive forces being generated between the package components during package operation.

In essence, the thermal performance of an electronic package, which may be constituted of a heat-generating element such as a semiconductor chip, and which is coupled to a heat-sinking member, such as a finned heat sink, or the like, may be implemented through the utilization of a specified thermally conductive material, and in which the thermal performance is governed by the highest thermal resistance present in the package. Quite frequently, this thermal resistance is encountered at the smallest area through which the heat which is generated must flow, and this typically occurs in a region or a gap between the chip dissipating the power and the heat sink, a cover plate or heat spreader. The resistance to heat flow in that direction is normally R=l/kA, where R represents the resistance in C/W, k is the thermal conductivity of the material present in the gap and l is the thickness of that material.

Pursuant to the inventive concept, compression between the various electronic package components can be provided through the use of a mechanical structure, such as springs or similar biasing elements imparting compression to the electronic package components, or through the employment of two adhesives possessing different coefficients of thermal expansion so as to, during operation of the electronic package, generate compressive forces improving the thermal performance of the electronic package.

2. Field of the Prior Art

The concept of employing compressive forces, and various methods of imparting such compressive forces to the components of electronic packages, is well-known in this technology.

Thus, U.S. Pat. No. 5,548,482, to Hatauchi et al., describes a module which is mechanically supported through the attachment thereof to a printed circuit board. The patent states that the supports for a card mounting the printed circuit board are attached by soldering, and thus, are able to support only limited stress above which the solder will tend to creep, especially at high operating temperatures. There is no clear disclosure of any method or structure to provide for the enhancement of the thermal performance of electronic packages analogous to that of the present invention.

U.S. Pat. No. 5,602,719, to Kinion, describes a structure to provide for electronic package level cooling, and not for chip levels, as disclosed by the present inventive concept. There is no disclosure of providing for an improved thermal performance through the intermediary of an adhesive and applied pressure during electronic package operation. There is only a disclosure of a thermal grease and no suggestion of utilizing an adhesive, such as preferably a thermal adhesive, as contemplated herein. Thermal grease tends to come out during operation because of package movement.

U.S. Pat. No. 5,022,462, to Flint et al., describes a flexible finned heat exchanger and is adapted to provide structure to replace TCM-like, multi-chip modules. Thermal enhancement is provided through the use of a grease, and not through an adhesive material, as provided by the present invention.

U.S. Pat. No. 5,581,442, to Morosas, describes a spring clip for clamping a heat sink module to an electronic module, and does not disclose the particular use of an adhesive, such as a thermal adhesive analogous to the present invention.

Similarly, U.S. Pat. No. 5,595,240, to Daikoku et al., also describes a cooling apparatus for electronic devices including a resilient spring structure located internally of a module, and there is no discussion of the effect of pressure acting on components of the electronic package to increase the thermal performance of the package through the use of an adhesive, such as a thermal adhesive.

SUMMARY OF THE INVENTION

The present invention, as set forth hereinabove, thus, describes a novel electronic package and a method of increasing or enhancing the thermal performance of the electronic package through the utilization, pursuant to one embodiment, of a mechanical spring structure employed in connection with an adhesive, preferably a thermal adhesive; and pursuant to a modified embodiment, the use of two thermal types of adhesives having different coefficients of thermal expansion so as to ensure, in both embodiments, the application of a compressive force or clamping pressure on the semiconductor chip.

Accordingly, it is an object of the present invention to provide a novel electronic package constituted of a heat-generating element which is thermally coupled to a heat-sinking member, and employing predetermined thermally conductive materials, wherein the heat-generating element, heat-sinking member and the conductive material are placed in compression during package operation.

A more specific object resides in the provision of an electronic package of the type described herein wherein the compression during operation of the electronic package is imparted through the use of a mechanical structure in conjunction with a preferably thermal adhesive.

Another object of the present invention resides in the provision of an electronic package of the type described utilizing two adhesives, preferably thermal adhesives, possessing different coefficients of thermal expansion, so as to impart the required compression to the heat-generating element and to resultingly improve the thermal performance of the electronic package during operation thereof.

BRIEF DESCRIPTION OF THE DRAWINGS

Reference may now be made to the following detailed description of the preferred embodiments of the invention, taken in conjunction with the accompanying drawings; in which.

DETAILED DESCRIPTION

Figure 1:
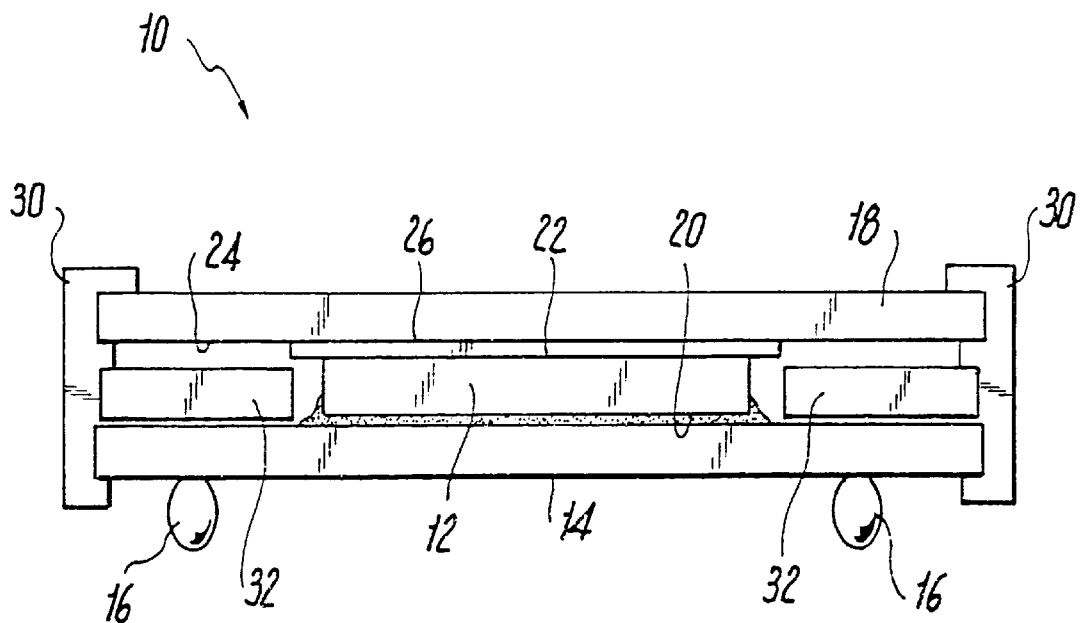
FIG. 1 illustrates a generally diagrammatic representation of a first embodiment of the electronic package pursuant to the invention.

In essence, referring to FIG. 1 of the drawings, there is illustrated an electronic package 10 in which a chip 12, such as a semiconductor chip, is positioned between a first plate 14 comprising a chip carrier having solder balls 16 on an opposite surface distant from the chip, and a second plate 18 constituting a cover plate or a heat-sink. The chip 12 is bonded to the chip carrier 14 at surface 20 thereof, and interposed between the opposite surface 22 of the chip 12 and the facing surface 24 of the cover plate 18 is an adhesive, preferably a thermal adhesive 26. In order to provide an improved degree of compression during operation of the electronic package 10, as the heat rises in the semiconductor chip 12, the surface 24 of the cover plate 18 facing the semiconductor chip 12 or adhesive 26 may be slightly concave in configuration. Mechanical springs or clips 30 are provided at opposite sides of the semiconductor chip, and may be equipped with internal stiffener elements 32, so as to impart a constant clamping effect to the semiconductor chip 12. During operation of the electronic package 10, the adhesive 26 which is interposed between the cover plate 18 and the semiconductor chip 12 will exhibit predetermined heat-dependent expansive characteristics, thereby, under the clamping effect of the mechanical springs or clips 30, increasing or maintaining the surface pressure on the semiconductor chip, so as to improve the thermal performance thereof.

Figure 2:
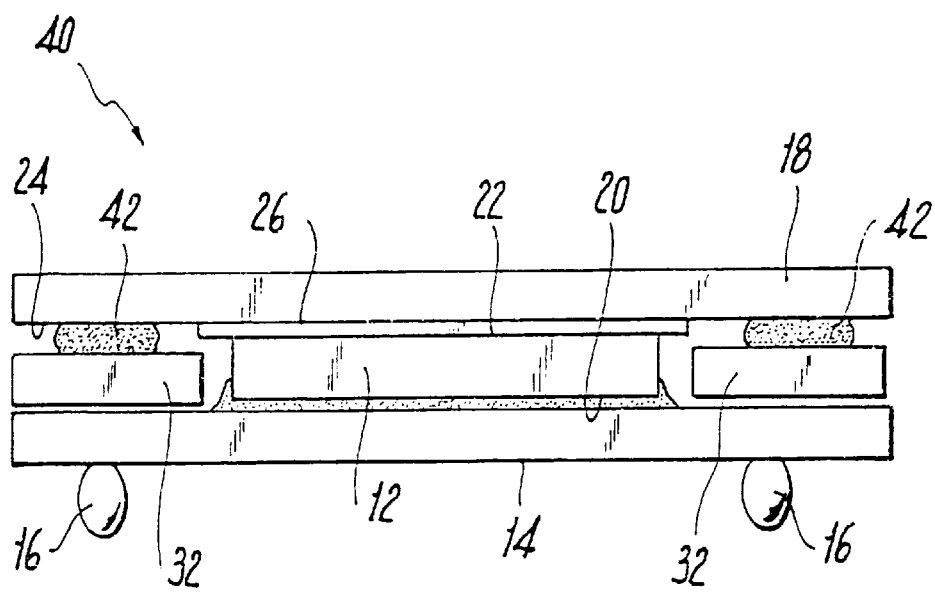
FIG. 2. illustrates, in a representation similar to FIG. 1, a modified embodiment of the electronic package utilizing two adhesives possessing different coefficients of thermal expansion.

Referring to the second embodiment of an electronic package 40 pursuant to the invention, as represented by FIG. 2 of the drawings, in which elements which are similar to or identical with those in FIG. 1 are identified by the same reference numerals, in that instance, rather than providing mechanical springs or clips, interposed between the surface 24 of the cover plate 18 and each of the stiffener elements 32 is a further adhesive, preferably a thermal adhesive 42 which possesses a different degree of thermal expansion from that of the adhesive 26 which is interposed between the semiconductor chip 12 and the facing surface of the cover plate or heat-sink 18. Thus, the further or second adhesive 42 which is interposed between the stiffener elements and the facing surface of the cover plate 18 or heat-sink has a lower coefficient of thermal expansion than that of the adhesive 26 which is positioned between the upper surface of the semiconductor chip and the facing surface of the cover plate. Thus, during operation of the electronic package, an increase in temperature will produce a greater degree of expansion of the thermal adhesive 26 between the semiconductor chip 12 and the cover plate 18 relative to that of the second thermal adhesive 42 between the stiffener elements 32 and the cover plate 18, thereby constantly imparting a compressive force or pressure to the semiconductor chip during operation of the electronic package 40.

It is noted that the effective thermal conductivity of the adhesive material, $K_{eff}$, is a function of the intrinsic material ability to conduct heat, as well as the quality of the interfaces between the thermal adhesive material 26 and the semiconductor chip 12, and the cover plate 18. Any air gaps or voids which may be present in either interface; in effect, between respectively the surface of the semiconductor chip 12 and the thermal adhesive 26, and the thermal adhesive 26 and the facing surface of the cover plate 18 or heat-sink, will considerably decrease the effective thermal conductivity and, hence, increase the resistance to heat flow.

Recent experimentation and data has indicated that the thermal resistance is a function of force applied at the foregoing interfaces; in essence, if the adhesive 26 is maintained in a compressed state during the life of the product or electronic package 40, it will exhibit a higher effective thermal conductivity. This data indicates that the thermal conductivity can be increased by a factor of up to 4, and potentially even higher, illustrated hereinbelow in Table I.

TABLE I

Thermal Conductivity of
Improved Vendor A, Vendor B and Vendor C Formulations

| Run # | Sample (Vendor) | T(C) | R_m (C/W) | k_eff (W/mk) | Comments |
|---|---|---|---|---|---|
| Vendor A bond thickness = 0.155 mm | | | | | |
| 1 | A | 33.5 | 0.175 | 1.40 | moderate pressure |
| 2 | A | 36.7 | 0.179 | 1.34 | moderate pressure (repeatability) |
| 3 | A | 33.5 | 0.164 | 1.46 | high pressure |
| Repeat after 1 week | | | | | |
| 4 | A | 37.5 | 0.354 | 0.68 | no pressure |
| 5 | A | 38.0 | 0.254 | 0.94 | moderate pressure |
| 6 | A | 36.5 | 0.171 | 1.40 | high pressure |
| 7 | A | 30.5 | 0.189 | 1.27 | release pressure (4 hr after release) |
| 8 | A | 37.5 | 0.225 | 1.07 | (12 hr after release) |
| Vendor B Bond Thickness = 0.16 mm | | | | | |
| 9 | B | 37.0 | 0.438 | 0.57 | no pressure |
| 10 | B | 34.5 | 0.226 | 1.09 | moderate pressure |
| 11 | B | 34.0 | 0.208 | 1.19 | high pressure |
| 12 | B | 33.0 | 0.356 | 0.70 | release pressure (4 hr after release) |
| Vendor C Bond Thickness = 0.1 mm | | | | | |
| 13 | C | 61.8 | 0.3 | 0.55 | no pressure |
| 14 | C | 26.0 | 0.093 | 2.12 | moderate pressure |
| 15 | C | 35.5 | 0.077 | 2.72 | high pressure |
| 14 | C | 36.5 | 0.08B | 2.27 | moderate pressure |
| 16 | C | 33.0 | 0.356 | 0.59 | release pressure (4 hr after release) |
| Repeat after 1 week | | | | | |
| 17 | C | 45.8 | 0.215 | 1.00 | moderate pressure |
| 18 | C | 32.3 | 0.091 | 2.17 | high pressure |

All test samples were sandwiched epoxy positioned between two aluminum plates.

The measurements were implemented by clamping the sample between a hot and a cold plate, with a guard heater to prevent back heat loss. The site heat loss was contained by insulation to within 1.2%, as revealed by finite difference simulations of the tester. Approximately four hours were required to reach steady state conditions through manual manipulation of the guard heaters to contain the prescribed heat loss. The resistance was for adhesive plus two interfaces (to the aluminum plate) only.

The effective conductivity was calculated from the thermal resistance for the given bond thickness.

The following is a summary of the data obtained (not necessarily in the order of the tests performed). T(c)=mean sample temperature; $R_m$=thermal resistance o the sample (bulk adhesive plus two interfaces) for one inch area; $k_{eff}$=the effective thermal conductivity (bulk plus two interfaces) assuming no change in initial bond thickness.

Calculations indicated that the uncertainty factor in resistance is less than 6% in all above measurements based on RMS analysis.

A NIST sample was tested for thermal resistance before and after the above set and was found to agree with the NIST value within 3%.

In conclusion, it was ascertained that Vendor C sample has a capability of greater than 2 W/mK. When the surface voids are compressed, an improvement in the resistance is ascertained. In order to realize the desired conductivity, the process needs to be improved in order to obtain good interface adhesive and/or positive pressure on the attachment. Release of pressure after high pressure reverted the resistance to a relatively poor value.

The Vendor A samples show the best value of about 1.4 W/mK. This value was the same as that obtained from a previous Vendor A formulation tested earlier, and the enhanced Vendor A formulation seemed to indicate somewhat similar results.

In summation, the cover plate or heat-sink material required a selection, so as not to significantly creep through the period of the life of the product. The clips attaching the cover plates to the substrate, as in the embodiment of FIG. 1, could be comprised of mechanical springs, so as to always maintain a compressive load on the adhesive.

As mentioned hereinabove, in the embodiment of FIG. 2, the cover plate is attached to the substrate by a different adhesive from that used between the chip and the cover plate, and whereby this adhesive has a lower coefficient of thermal expansion than the previous adhesive, the chip to cover plate interface will remain in compression. Furthermore, since the chip to cover plate adhesive typically operates at somewhat higher temperatures than the adhesive between the stiffeners and the cover plate, this will aid in maintaining a compressive force or load, since the higher temperature will result in a greater expansion of the previously mentioned adhesive.

It is also possible to contemplate that a mechanical spring may be positioned above the heat spreader or cover plate, but below the heat sink, thus, for example, in a multi-chip carrier, individual spring loaded spreaders could be positioned on each chip and, in turn, these would be conducting heat to a heat-sink.

While the invention has been particularly shown and described with respect to preferred embodiments thereof, it will be understood by those skilled in the art that the foregoing and other changes in form and details may be made therein without departing from the spirit and scope of the invention.

Having thus described our invention, what we claim as new, and desire to secure by Letters Patent is:

1. An electronic package including means for applying a compressive force to the components of said electronic package during operation so as to enhance the thermal performance thereof, said electronic package components comprising a chip carrier, a semiconductor chip being mounted on said clip carrier, and a cover plate positioned over said semiconductor chip; said compressive force applying means comprising means for clamping said cover plate to said chip carrier, and a first adhesive being interposed between said semiconductor chip and said cover plate, said adhesive expanding responsive to heat being generated during operation of said electronic package and maintains the compressive force on said semiconductor chip, stiffener members being positioned between said cover plate and chip carrier adjacent opposite end surfaces of said semiconductor chip, said clamping means comprising a second adhesive positioned between each said stiffener member and the facing surface of said cover plate to maintain said semiconductor chip in clamped relationship between said cover plate and chip carrier.

2. An electronic package as claimed in claim 1, wherein said first adhesive possesses a higher coefficient of thermal expansion than the coefficient of thermal expansion of said second adhesive whereby heat generated during operation of said electronic package will increase the compressive force acting on said semiconductor chip and enhance the thermal performance thereof.

3. An electronic package as claimed in claim 1, wherein said first and second adhesives each comprise a thermal adhesive.

4. A method of applying a compressive force to components of an electronic package during operation so as to enhance the thermal performance thereof, said electronic package components comprising a chip carrier, a semiconductor chip being mounted on said clip carrier, and a cover plate positioned over said semiconductor chip; said method comprising clamping said cover plate to said chip carrier, and interposing a first adhesive between said semiconductor chip and said cover plate, said adhesive expanding responsive to heat being generated during operation of said electronic package and maintains the compressive force on said semiconductor chip, stiffener members being positioned between said cover plate and chip carrier adjacent opposite end surfaces of said semiconductor chip, said clamping being effected by positioning a second adhesive between each said stiffener member and the facing surface of said cover plate to maintain said semiconductor chip in clamped relationship between said cover plate and chip carrier.

5. A method as claimed in claim 4, wherein said first adhesive possesses a higher coefficient of thermal expansion than the coefficient of thermal expansion of said second adhesive whereby heat generated during operation of said electronic package will increase the compressive force acting on said semiconductor chip and enhance the thermal performance thereof.

6. A method as claimed in claim 4, wherein said first and second adhesives each comprise a thermal adhesive.

\* \* \* \* \*

UNITED STATES PATENT AND TRADEMARK OFFICE
CERTIFICATE OF CORRECTION

PATENT NO. : 6,058,015
DATED : May 2, 2000
INVENTOR(S) : Baghat Ghaleb Sammakia, et al.

It is certified that error appears in the above-identified patent and that said Letters Patent are hereby corrected as shown below:

Column 4, Line 37: "0.0B" should read --0.08--

Column 5, Line 52, Claim 1: "clip" should read --chip--

Column 6, Line 29, Claim 4: "clip" should read --chip--

Signed and Sealed this

Twenty-fourth Day of April, 2001

Attest:

NICHOLAS P. GODICI

Attesting Officer      Acting Director of the United States Patent and Trademark Office